(12) United States Patent
Tanaka et al.

(10) Patent No.: US 8,853,920 B2
(45) Date of Patent: Oct. 7, 2014

(54) PIEZOELECTRIC CERAMIC COMPOSITION CONSISTING OF A PEROVSKITE-TYPE OXIDE AND PIEZOELECTRIC ELEMENT

(75) Inventors: Daisuke Tanaka, Tokyo (JP); Masahito Furukawa, Tokyo (JP); Takeo Tsukada, Tokyo (JP)

(73) Assignee: TDK Corporation, Tokyo (JP)

( * ) Notice: Subject to any disclaimer, the term of this patent is extended or adjusted under 35 U.S.C. 154(b) by 365 days.

(21) Appl. No.: 13/263,374

(22) PCT Filed: May 21, 2010

(86) PCT No.: PCT/JP2010/058652
§ 371 (c)(1),
(2), (4) Date: Oct. 7, 2011

(87) PCT Pub. No.: WO2010/134604
PCT Pub. Date: Nov. 25, 2010

(65) Prior Publication Data
US 2012/0019108 A1  Jan. 26, 2012

(30) Foreign Application Priority Data

May 22, 2009 (JP) .................................. 2009-124252

(51) Int. Cl.
| | |
|---|---|
| H01L 41/187 | (2006.01) |
| H01L 41/273 | (2013.01) |
| C04B 35/495 | (2006.01) |
| H03H 9/17 | (2006.01) |
| H01L 41/43 | (2013.01) |
| H01L 41/083 | (2006.01) |

(52) U.S. Cl.
CPC ........... *H01L 41/273* (2013.01); *C04B 2235/80* (2013.01); *C04B 2235/3294* (2013.01); *H01L 41/1873* (2013.01); *C04B 2235/3213* (2013.01); *C04B 2235/3215* (2013.01); *C04B 2235/768* (2013.01); *C04B 2235/3248* (2013.01); *C04B 35/495* (2013.01); *C04B 2235/3251* (2013.01); *C04B 2235/3244* (2013.01); *C04B 2235/3203* (2013.01); *H03H 9/176* (2013.01); *H03H 9/178* (2013.01); *H01L 41/43* (2013.01); *H01L 41/083* (2013.01); *C04B 2235/3201* (2013.01)
USPC ..................................... 310/358; 252/62.9 PZ

(58) Field of Classification Search
CPC ......................... H01L 41/1871; H01L 41/1873
USPC ......................... 310/358; 252/62.9 R; 501/134
See application file for complete search history.

(56) References Cited

U.S. PATENT DOCUMENTS

| | | | |
|---|---|---|---|
| 2004/0214723 A1 | 10/2004 | Nonoyama et al. | |
| 2013/0241347 A1* | 9/2013 | Suzuki et al. | 310/311 |

FOREIGN PATENT DOCUMENTS

JP  2004/300019  10/2004

OTHER PUBLICATIONS

S. Zhang et al., "Mitigation of thermal and fatigue behavior in $K_{0.5}Na_{0.5}NbO_3$-based lead free piezoceramics", Applied Physics Letters 92 (2008).

(Continued)

*Primary Examiner* — J. San Martin
(74) *Attorney, Agent, or Firm* — Drinker Biddle & Reath LLP

(57) ABSTRACT

A piezoelectric ceramic composition including a perovskite-type oxide, wherein the perovskite-type oxide has Na, K, Li, Ba and Sr at the A site and Nb, Ta and Zr at the B site, and has a crystal phase transition in a temperature range of −50 to 150° C., the crystal phase transition being accompanied by an endotherm of no greater than 4 J/g, as well as a piezoelectric element 20 provided with a piezoelectric ceramic 1 that contains the piezoelectric ceramic composition.

4 Claims, 3 Drawing Sheets

(56) References Cited

OTHER PUBLICATIONS

M. Furukawa et al., "Alkaline Niobate-based Lead-free Piezoelectric Ceramics", Abstract Book, The 6th Asian Meeting on Electroceramics, The 28th Electronics Division Meeting of CJS, p. 38, Oct. 2008.

D. Tanaka et al., "Thermal Reliability of Alkaline Niobate-Based Lead-Free Piezoelectric Ceramics", Japanese Journal of Applied Physics, vol. 48, Sep. 2009.

* cited by examiner

PIEZOELECTRIC CERAMIC COMPOSITION CONSISTING OF A PEROVSKITE-TYPE OXIDE AND PIEZOELECTRIC ELEMENT

TECHNICAL FIELD

The present invention relates to a piezoelectric ceramic composition and to a piezoelectric element composed of it.

BACKGROUND ART

Known piezoelectric ceramics exhibit piezoelectricity, whereby application of an electric field generates mechanical strain and stress. Such piezoelectric ceramics are used in various types of piezoelectric elements including actuators, piezoelectric buzzers, sounding bodies, sensors and the like.

Actuators employing piezoelectric ceramics characteristically allow high precision to be obtained for fine displacement and produce large generated stress, and they are used for positioning of precision machine tools and optical devices. The compositions for piezoelectric ceramics used in actuators are, in most cases, made of lead zirconate titanate (PZT) which has excellent piezoelectric properties. However, because lead zirconate titanate contains a large amount of lead, concerns have been raised in recent years regarding the effects on the environment by elution of lead caused by acid rain. A demand therefore exists for a piezoelectric ceramic composition with a satisfactorily reduced lead content, as a substitute for lead zirconate titanate. Lead-free piezoelectric ceramic compositions have therefore been proposed to meet this demand (see Patent document 1).

Barium titanate ($BaTiO_3$) is known as a typical lead-free piezoelectric ceramic composition with a perovskite structure. Because it has insufficient piezoelectric characteristics, however, other piezoelectric ceramic compositions are being investigated. Alkali niobates such as $K_{0.5}Na_{0.5}NbO_3$ (KNN) are being studied for use, as piezoelectric ceramic compositions that can realize relatively high piezoelectric characteristics near ordinary temperature (see Non-patent document 1).

It is expected that high piezoelectric characteristics can be obtained by using such piezoelectric ceramic compositions as piezoelectric ceramic materials in ordinary devices. However, alkali niobates with high piezoelectric characteristics usually have an orthorhombic-tetragonal phase transition temperature near room temperature, and when they are used in environments with thermal cycles that straddle the crystal phase transition temperature, repeated crystal phase transition alters the domain structure of the ferroelectric substance and lowers the piezoelectric characteristics (see Non-patent document 1).

CITATION LIST

Patent Literature

[Patent document 1] Japanese Unexamined Patent Application Publication No. 2004-300019

Non-Patent Literature

[Non-patent document 1] Shujun Zhang et al., "Mitigation of thermal and fatigue behavior in K0.5Na0.5NbO3-based lead free piezoceramics", Applied Physics Letters 92, 152904 (2008)

SUMMARY OF INVENTION

Technical Problem

A demand therefore exists for a piezoelectric ceramic composition that comprises a perovskite-type oxide containing no Pb as a constituent element, and that is resistant to reduction in piezoelectric characteristics even when used in environments in which the temperature varies near device operating temperatures (−50 to 150° C.).

The present invention has been accomplished in light of these circumstances, and its object is to provide a piezoelectric ceramic composition that adequately minimizes reduction in piezoelectric characteristics due to temperature variation and that can maintain excellent piezoelectric characteristics, as well as a piezoelectric element composed of the piezoelectric ceramic composition.

Solution to Problem

In order to achieve the object stated above, the invention provides a piezoelectric ceramic composition comprising a perovskite-type oxide, wherein the perovskite-type oxide has Na, K, Li, Ba and Sr at the A site and Nb, Ta and Zr at the B site, and has a crystal phase transition in a temperature range of −50 to 150° C., the crystal phase transition being accompanied by an endotherm of no greater than 4 J/g.

According to the piezoelectric ceramic composition of the invention, it is possible to adequately prevent time-related reduction in piezoelectric characteristics caused by temperature variation near the operating temperatures of devices such as automobiles and electronic devices. The present inventors conjecture that the cause for this obtained effect is as follows. Because the piezoelectric ceramic composition of the invention comprises a perovskite oxide that undergoes crystal phase transition near device operating temperatures, it has excellent piezoelectric characteristics at such operating temperatures. Also, since the crystal phase transition is accompanied by an endotherm of no greater than 4 J/g, which is smaller than with conventional piezoelectric ceramic compositions, it is possible to prevent sudden progression of the crystal phase transition of the perovskite-type oxide due to temperature variation, thus allowing a state of polarization to be satisfactorily maintained. This presumably can prevent sudden changes in domain structure and allows excellent piezoelectric characteristics to be maintained, even under continuous use in temperature environments that straddle the phase transition temperature due to temperature variation.

The piezoelectric ceramic composition of the invention preferably has a Sr and Zr content ratio of 4.5-7 mol % in terms of $SrZrO_3$, with respect to the total perovskite-type oxide. This will allow reduction in the piezoelectric characteristics due to temperature variation to be even more satisfactorily inhibited.

According to another aspect, the invention provides a piezoelectric ceramic composition comprising a perovskite-type oxide represented by the following formula (1).

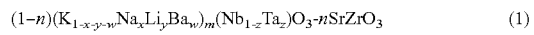

$$(1-n)(K_{1-x-y-w}Na_xLi_yBa_w)_m(Nb_{1-z}Ta_z)O_3\text{-}nSrZrO_3 \quad (1)$$

[In formula (I), x, y, z, w, m and n satisfy the following inequalities.
$0.4 < x \leq 0.7$
$0.02 \leq y \leq 0.3$
$0.5 \leq x+y < 0.75$
$0 < z \leq 0.3$
$0 < w \leq 0.01$
$0.98 \leq m \leq 1.0$
$0.045 \leq n \leq 0.07$]

A piezoelectric ceramic composition comprising a perovskite-type oxide having such a composition can adequately prevent reduction in piezoelectric characteristics due to temperature variation near device operating temperatures. The present inventors conjecture that the cause for this obtained effect is as follows. Because the piezoelectric ceramic composition comprises a perovskite-type oxide having the composition specified above, it undergoes crystal phase transition near device operating temperatures. It therefore exhibits excellent piezoelectric characteristics near device operating temperatures. Also, since the endotherm accompanying crystal phase transition can be sufficiently reduced, it is possible to prevent sudden progression of the crystal phase transition of the perovskite-type oxide due to temperature variation, thus allowing a state of polarization to be satisfactorily maintained. This presumably can prevent sudden changes in domain structure and allows excellent piezoelectric characteristics to be maintained, even under continuous use in temperature environments that straddle the crystal phase transition temperature due to temperature variation.

According to yet another aspect, the invention provides a piezoelectric element comprising a piezoelectric ceramic composed of the aforementioned piezoelectric ceramic composition, and an electrode formed on the surface of the piezoelectric ceramic. The piezoelectric element of the invention may also be a piezoelectric element comprising an element assembly having internal electrodes and piezoelectric ceramics composed of any of the aforementioned piezoelectric porcelain compositions, laminated in an alternating manner, and a pair of terminal electrodes that are formed at both end faces of the element assembly so as to sandwich the element assembly and are electrically connected to the internal electrodes.

Since the piezoelectric element of the invention comprises a piezoelectric ceramic composed of the piezoelectric ceramic composition having such characteristics, it can adequately prevent reduction in piezoelectric characteristics due to temperature variation near device operating temperatures.

Advantageous Effects of Invention

According to the invention it is possible to provide a piezoelectric ceramic composition that adequately minimizes reduction in piezoelectric characteristics due to temperature variation and that can maintain excellent piezoelectric characteristics, as well as a piezoelectric element composed of the piezoelectric ceramic composition.

DESCRIPTION OF EMBODIMENTS

Preferred embodiments of the invention will now be explained with reference to the accompanying drawings where necessary.

Figure 1:
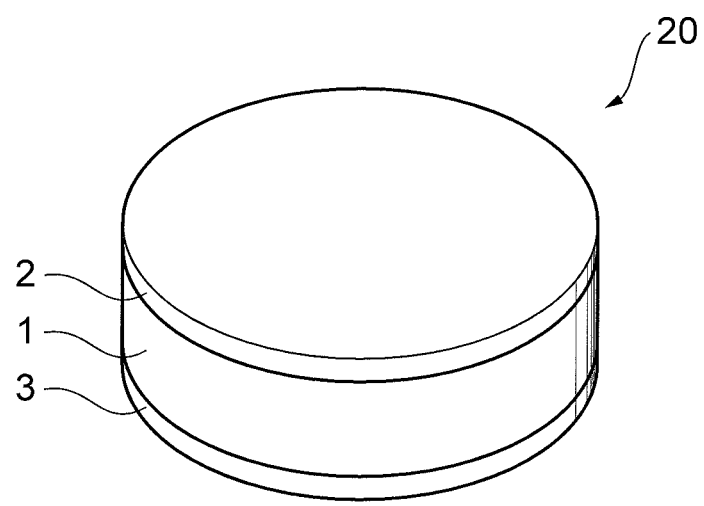
FIG. 1 is a perspective view of an embodiment of a piezoelectric element of the invention.

FIG. 1 is a perspective view of an embodiment of a piezoelectric element of the invention. The piezoelectric element 20 comprises a piezoelectric ceramic 1 and electrodes 2, 3 formed on both surfaces thereof facing the piezoelectric ceramic 1.

The piezoelectric ceramic 1 is polarized in the direction of thickness, i.e. the direction in which the pair of electrodes 2, 3 are facing, and application of a voltage between the electrodes 2, 3 can produce longitudinal vibration in the thickness direction and vibration diffusing in the radial direction. The electrodes 2, 3 are formed of a metal such as gold (Au), for example. An external power source (not shown) may also be electrically connected to the electrodes 2, 3 via a wire or the like.

The piezoelectric ceramic 1 is a sintered body composed of a piezoelectric ceramic composition according to an embodiment of the invention, and the piezoelectric ceramic composition contains a perovskite-type oxide as the main component. The perovskite-type oxide, represented by the general formula $ABO_3$, has Na, K, Li, Ba and Sr as essential elements at the A site, and Nb, Ta and Zr as essential elements at the B site. The perovskite-type oxide may also be a solid solution comprising two or more components.

The piezoelectric ceramic composition of this embodiment comprises a perovskite-type oxide having a crystal phase transition temperature in the range of −50 to 150° C., and the endotherm accompanying crystal phase transition is no greater than 4 J/g based on the total piezoelectric ceramic composition, which is sufficiently low compared to conventional piezoelectric ceramic compositions. The perovskite-type oxide undergoes crystal phase transition from orthorhombic to tetragonal, for example, or vice-versa, with temperature increase or temperature decrease within the temperature range of −50 to 150° C. From the viewpoint of obtaining a piezoelectric ceramic composition exhibiting even more excellent piezoelectric characteristics near room temperature, the perovskite-type oxide has a crystal phase transition temperature of preferably 0 to 100° C., more preferably 5 to 50° C. and even more preferably 10 to 40° C. The endotherm accompanying crystal phase transition is preferably 0-3 J/g and more preferably 0-2 J/g, based on the total piezoelectric ceramic composition.

Since the crystal phase of the piezoelectric ceramic composition can be identified by X-ray diffraction, the presence or absence of crystal phase transition can be determined by X-ray diffraction. Thus, the crystal phase transition temperature of the perovskite-type oxide can be confirmed by performing X-ray diffraction measurements while raising or lowering the temperature of the piezoelectric ceramic composition, for example.

Measurement of the endotherm accompanying crystal phase transition can be performed using a differential scanning calorimeter. Specifically, differential scanning calorimetry analysis and X-ray diffraction analysis may be carried out in parallel while raising or lowering the temperature of the piezoelectric ceramic composition, and the endothermic peak in differential scanning calorimetry analysis at the point where crystal phase transition has been detected by X-ray diffraction analysis, may be used to calculate the endotherm accompanying crystal phase transition.

The piezoelectric ceramic composition of this embodiment may contain, in addition to the perovskite-type oxide, another metal compound or unavoidable impurities, as accessory components, in ranges such that the effect of the invention is not particularly impeded. Metal compounds preferably include Mn compounds such as Mn oxide, or Cu compounds such as Cu oxide. By including a Mn compound or a Cu compound it is possible to improve the electromechanical coupling coefficient (Qm) of the piezoelectric ceramic 1.

However, from the viewpoint of even further preventing reduction in piezoelectric characteristics due to temperature variation, the content of the perovskite-type oxide in the piezoelectric ceramic composition is preferably 90 mass % or greater, more preferably 95 mass % or greater, even more preferably 98 mass % or greater and most preferably 99 mass % or greater.

The piezoelectric ceramic composition may contain lead (Pb), but the content is preferably no greater than 1 mass %, and more preferably it contains absolutely no lead. A piezoelectric ceramic composition with a satisfactorily reduced lead content will release only a minimal amount of lead into the environment by volatilization of lead during firing and upon disposal after it has been distributed on the market as a piezoelectric part, such as a piezoelectric element. Such a piezoelectric ceramic composition may be suitably used as a material, for example, for an oscillating element such as an actuator serving as a piezoelectric element, sounding body, sensor or the like.

The perovskite-type oxide in the piezoelectric ceramic composition of this embodiment preferably has a composition represented by the following formula (1), from the viewpoint of improved piezoelectric characteristics.

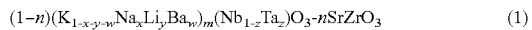

$$(1-n)(K_{1-x-y-w}Na_xLi_yBa_w)_m(Nb_{1-z}Ta_z)O_3 \cdot nSrZrO_3 \quad (1)$$

[In formula (1), x, y, z, w, m and n satisfy the following.
$0.4 < x \leq 0.7$,
$0.02 \leq y \leq 0.3$,
$0.5 \leq x+y < 0.75$,
$0 < z \leq 0.3$,
$0 < w \leq 0.01$,
$0.98 \leq m \leq 1.0$, and
$0.045 \leq n \leq 0.07$.]

In this case, the piezoelectric ceramic composition contains a solid solution of $(K_{1-x-y}Na_xLi_yBa_w)_m(Nb_{1-z}Ta_z)O_3$ and $SrZrO_3$, as the perovskite-type oxide. The molar ratio of $SrZrO_3$ with respect to the entire solid solution, i.e. the entire perovskite-type oxide, is 4.5-7 mol %. The molar ratio is more preferably 5-6 mol %. That is, n in formula (1) preferably satisfies $0.05 \leq n \leq 0.06$. This will allow reduction in the piezoelectric characteristics due to temperature variation to be even more satisfactorily inhibited. The molar ratio can be measured by ICP emission spectroscopic analysis, for example.

In formula (1), x preferably satisfies $0.45 \leq x \leq 0.6$, and more preferably $0.5 \leq x \leq 0.55$. If x is a value satisfying this numerical range, it will be possible to obtain a piezoelectric ceramic composition with even more excellent piezoelectric characteristics. Also, y preferably satisfies $0.02 \leq y \leq 0.2$, and more preferably $0.03 \leq y \leq 0.1$. If y is a value satisfying this numerical range, it will be possible to obtain a piezoelectric ceramic composition with even more excellent piezoelectric characteristics.

In formula (1), z preferably satisfies $0.04 \leq z \leq 0.2$, and more preferably $0.05 \leq z \leq 0.15$. If z is a value satisfying this numerical range, it will be possible to obtain a piezoelectric ceramic composition with even more excellent piezoelectric characteristics. Also, w preferably satisfies $0.001 \leq w \leq 0.008$, and more preferably $0.003 \leq w \leq 0.007$. If w is a value satisfying this numerical range, it will be possible to obtain a piezoelectric ceramic composition with even more excellent piezoelectric characteristics. Also, m preferably satisfies $0.99 \leq m \leq 1$. If m is a value satisfying this numerical range, it will be possible to obtain a piezoelectric ceramic composition with even more excellent piezoelectric characteristics.

The piezoelectric ceramic 1 preferably has a relative density of 95% or greater. A piezoelectric ceramic 1 composed of a sintered body having such a high relative density will exhibit even more excellent piezoelectric characteristics. The relative density of the piezoelectric ceramic 1 can be measured by Archimedes' method. The relative density of the piezoelectric ceramic 1 can be adjusted by varying the firing temperature or firing time.

A process for production of the piezoelectric element 20 shown in FIG. 1 will now be explained. First, each oxide powders comprising lithium, sodium, potassium, barium, strontium, niobium, zirconium, barium and tantalum, for example, are prepared as starting materials for the perovskite-type oxide as the main component of the piezoelectric ceramic 1. The starting materials of the perovskite-type oxide may be materials that form oxides by firing, such as carbonates or oxalates of the aforementioned metal elements, instead of oxides.

After thoroughly drying each prepared starting material, the starting materials are mixed in a proportion for the composition represented by formula (1), and calcined at 700-950° C. for 2-4 hours. This yields a calcined body comprising a perovskite-type oxide represented by formula (1) above.

Next, the calcined body is thoroughly pulverized in an organic solvent or water using a ball mill. The ground product obtained by pulverizing is dried and press molded using a uniaxial pressing machine, cold isostatic press (CIP) or the like and fired at 1000-1200° C. for 2-8 hours. This can yield a sintered body containing a perovskite-type compound represented by formula (1) as the main component. The firing can be carried out in air, for example, and the relative density of the sintered body can be adjusted by varying the firing temperature or firing time.

The obtained sintered body is then worked if necessary, electrodes 2, 3 are formed on both surfaces of the worked sintered body, and an electric field is applied in heated silicone oil for poling treatment. This yields the piezoelectric ceramic (sintered body) 1 shown in FIG. 1, and a piezoelectric element 20 comprising the piezoelectric ceramic 1 and the electrodes 2, 3 formed sandwiching the piezoelectric ceramic 1. The electrodes 2, 3 can be formed by coating a paste of Ag (silver) or the like on the surface of the sintered body, and then drying and firing.

The method for producing the piezoelectric ceramic 1 is not limited to the one described above, and it may instead be a hydrothermal synthesis process or sol-gel process.

The piezoelectric element 20 of this embodiment comprises a piezoelectric ceramic 1 composed of a piezoelectric ceramic composition containing a perovskite-type oxide represented by formula (1) as the main component. The piezoelectric ceramic composition contains a perovskite-type oxide having a crystal phase transition temperature near room temperature, and the endotherm accompanying crystal phase transition is sufficiently small. Therefore, although it contains substantially no lead, reduction in the piezoelectric characteristics can be adequately prevented even when it is continuously used in an environment with temperature variation near the crystal phase transition temperature, and excellent piezoelectric characteristics can be maintained for prolonged periods.

Another embodiment of a piezoelectric element according to the invention will now be explained.

Figure 2:
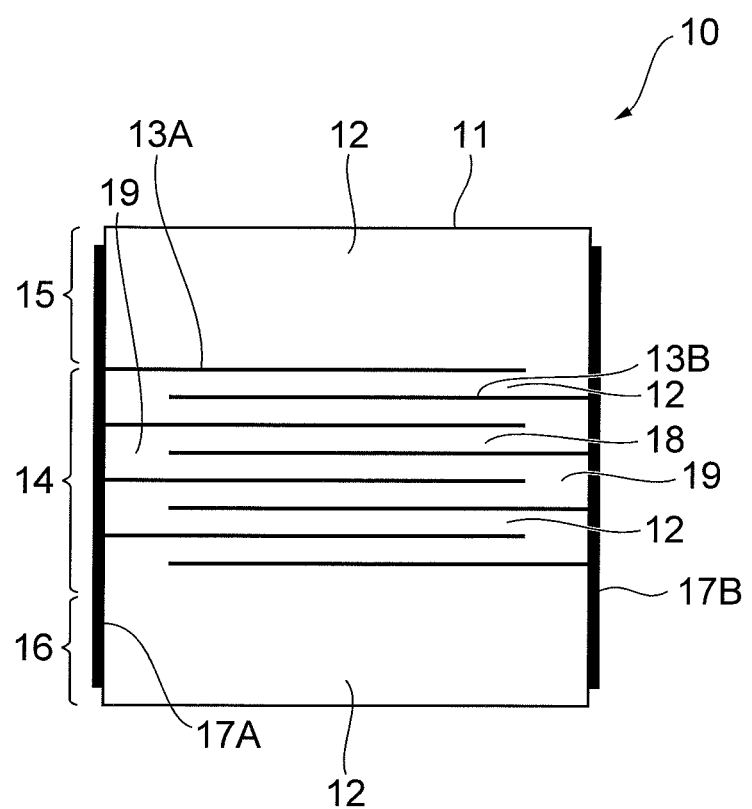
FIG. 2 is a side view of another embodiment of a piezoelectric element of the invention.

FIG. 2 is a side view of another embodiment of a piezoelectric element of the invention. The stacked piezoelectric element 10 shown in FIG. 2, which is a piezoelectric element in stacked form, comprises a cuboid laminated body 11 and a pair of terminal electrodes 17A, 17B formed on the end faces facing the laminated body 11.

The laminated body 11 is composed of an element assembly 14 obtained by alternating lamination of internal electrode layers (electrode layers) 13A, 13B via piezoelectric layers 12, and a pair of protective layers 15 and 16 formed sandwiching the element assembly 14 from both end faces (above and below in the drawing) in the lamination direction. In the element assembly 14, the piezoelectric layers 12 and internal electrode layers 13A, 13B are alternately laminated.

The piezoelectric layer 12 is a layer composed of a piezoelectric ceramic comprising a piezoelectric ceramic composition according to the embodiment described above. The piezoelectric ceramic has the same composition as the piezoelectric ceramic 1 in the piezoelectric element 20 of the embodiment described above. The thickness of each layer of the piezoelectric layer 12 may be set as desired, and may be 1-100 μm, for example.

The internal electrode layers 13A are formed in such a manner that one end of each is exposed at the end face of the laminated body 11 on which the terminal electrode 17A has been formed. The internal electrode layers 13B are formed in such a manner that one end of each is exposed at the end face of the laminated body 11 on which the terminal electrode 17B has been formed. The internal electrode layers 13A, 13B are formed parallel to each other, and the internal electrode layer 13A and internal electrode 13B are situated so that their major sections are stacked in the direction of lamination.

The active regions 18 of the piezoelectric layers 12 between the internal electrodes 13A, 13B are the active sections that expand (are displaced) in the direction of lamination when a voltage is applied to the internal electrodes 13A, 13B. The regions 19 that are not between the internal electrodes 13A, 13B are the inactive sections.

The material used for the internal electrode layers 13A, 13B may be, for example, a metal such as Au, Pt, Pd, Ni, Cu or Ag, or an alloy containing two or more of such metals (such as an Ag—Pd alloy). The protective layers 15,16 are composed of a ceramic, and are preferably layers composed of a piezoelectric ceramic. Piezoelectric ceramics for formation of the protective layers 15,16 include those having the same composition as the piezoelectric layer 12. The composition of the piezoelectric ceramics composing the protective layers 15,16 and the piezoelectric layer 12 may be the same or different.

The terminal electrodes 17A, 17B are in contact with the ends of the internal electrodes 13A, 13B exposed at the end faces of the laminated body 11 on which they are formed. Electrical connection is thus established between the terminal electrodes 17A, 17B and the internal electrodes 13A, 13B. The terminal electrodes 17A, 17B may be composed of a conductive material consisting mainly of Ag, Au, Cu or the like. The thicknesses of the terminal electrodes 17A, 17B may be appropriately set according to the purpose of use and the size of the stacked piezoelectric element, and for example, they may be 10-50 μm.

A method for producing the stacked piezoelectric element 10 will now be explained. In the method for producing the stacked piezoelectric element 10, first oxide powders, carbonate powders or oxalate powders containing lithium, sodium, potassium, strontium, niobium, zirconium, barium and tantalum are prepared as starting materials for the perovskite-type oxide, similar to the method for producing the piezoelectric ceramic 1. These are mixed in prescribed proportions and subjected to wet grinding with a ball mill or the like, and then dried to obtain a mixed powder. Next, an organic binder, organic solvent, organic plasticizer and the like are added to the mixed powder and mixed therewith for about 20 hours using a ball mill or the like, to obtain a piezoelectric paste.

The piezoelectric paste is coated onto a polyethylene terephthalate (PET) base film by doctor blading, for example, to obtain a piezoelectric green sheet for formation of the piezoelectric layers 12. The piezoelectric green sheet comprises mainly the mixed powder and a binder.

The piezoelectric green sheet is then coated with an electrode paste for formation of the internal electrodes 13A, 13B by a screen printing method or the like, to form an electrode paste layer composed of the electrode paste. A laminating sheet is thus obtained comprising the electrode paste layer on the piezoelectric green sheet. The electrode paste layer is formed into a pattern to obtain the shapes of the aforementioned internal electrodes 13A and 13B.

The electrode paste used to form the electrode paste layer contains a metal such as Au, Pt, Pd, Ni, Cu or Ag, or an alloy of two or more of such metals (Ag—Pd alloy, for example), a binder and an organic solvent. The binder and organic solvent may be publicly known ones. The total content of the metal in the electrode paste is preferably at least 40 mass % and more preferably 50-60 mass %.

Several laminating sheets are then stacked in such a manner that the electrode paste layers and piezoelectric green sheets are alternately situated, and several piezoelectric green sheet layers are further laminated onto the surface of both end faces in the direction of lamination of the laminated structure. The laminated body obtained in this manner is pressed in the direction of lamination while heating appropriately, and is cut to the prescribed size if necessary, to obtain a green laminated body (laminated body).

The green laminated body is then set on a stabilized zirconia setter or the like and heated in an air atmosphere for degreasing treatment to remove the binder or organic solvent in the piezoelectric green sheet and electrode paste layer.

Next, the green laminated body from which the binder has been removed is subjected to firing treatment (main firing) by heating in a sealed container (air atmosphere), at 1000-1200° C. for 2-8 hours, for example, to obtain a laminated body 11. The piezoelectric green sheet and electrode paste layer are integrally fired in this main firing treatment, the internal electrodes 13A, 13B are formed from the electrode paste layer, and the piezoelectric layers 12 are formed from the piezoelectric green sheet sandwiched between the internal electrodes 13A, 13B. Also, the protective layers 15,16 are formed from the laminated piezoelectric green sheet on both end faces in the direction of lamination of the green laminated body.

The terminal electrodes 17A, 17B are then baked onto the mutually opposing end faces that are parallel in the direction of lamination of the obtained laminated body 11 (the end faces where the internal electrode 13A, 13B terminals are exposed). Specifically, a terminal electrode-forming paste containing the metal for the terminal electrodes 17A, 17B, the organic binder and other components is coated onto the aforementioned end faces of the laminated body 11 and then fired to form the terminal electrodes 17A, 17B. This produces a stacked piezoelectric element 10 having the structure shown in FIG. 2. The terminal electrodes 17A, 17B can also be formed by a method such as sputtering, vapor deposition, electroless plating or the like, instead of the baking method described above.

The stacked piezoelectric element 10 may also be subjected to poling treatment wherein a voltage is applied between the terminal electrodes 17A, 17B for about 10-30 minutes to an electric field strength of 2-5 kV/mm in an environment of room temperature to 150° C., to obtain a stacked piezoelectric element 10 that functions as a piezoelectric actuator.

The stacked piezoelectric element 10 of this embodiment comprises a piezoelectric layer 12 composed of a piezoelectric ceramic composition containing a perovskite-type oxide represented by formula (1) as the main component. The piezoelectric ceramic composition contains a perovskite-type oxide having a crystal phase transition temperature near room temperature, and the endotherm accompanying crystal phase transition is sufficiently small. Therefore, although it contains substantially no lead, reduction in the piezoelectric characteristics occurring with temperature variation can be adequately prevented even when it is continuously used near the crystal phase transition temperature, and excellent piezoelectric characteristics can be maintained for prolonged periods.

The embodiments described above are only preferred embodiments of the invention, and the invention is in no way limited thereto. For example, the composition of the perovskite-type oxide in the piezoelectric ceramic 1 is not limited to one represented by formula (1) above, and any one having Na, K, Li, Ba and Sr at the A site and Nb, Ta and Zr at the B site, as well as a crystal phase transition in a temperature range of −50 to 150° C. and an endotherm accompanying crystal phase transition of no greater than 4 J/g based on the total piezoelectric ceramic composition, may be used without any particular restrictions.

EXAMPLES

The present invention will now be explained in greater detail based on examples and comparative examples, with the understanding that these examples are in no way limitative on the invention.

Examples 1-4, Comparative Examples 1-8, Reference Example 1

[Fabrication of Piezoelectric Element]
A piezoelectric element 20 such as shown in FIG. 1 was fabricated by the following procedure. First, as the starting powder for the perovskite-type oxide there were prepared $K_2CO_3$ powder, $Nb_2O_5$ powder, $BaCO_3$ powder, $TiO_2$ powder, $Ta_2O_5$ powder, $ZrO_2$ powder, $Li_2CO_3$ powder, $SrCO_3$ powder, $PbO_2$ powder, $ZnO_2$ powder and $Sb_2O_3$ powder. After thoroughly drying the starting powders, they were combined in proportions for the composition listed in Table 1, and thoroughly mixed in purified water using a ball mill to obtain a mixed powder. The mixed powder was then dried and calcined at 700-950° C. for 2 hours. To the powder obtained by calcination there was added polyvinyl alcohol (PVA), and after pressing by uniaxial molding, the binder was removed and firing was conducted in a sealed system under firing conditions of 950-1160° C., 2 hours, to obtain a sintered body.

The obtained sintered body was polished and cut, gold electrodes were formed by sputtering on the opposite surfaces of the sintered body, and poling treatment was carried out under conditions of 120-150° C., 15 minutes, 2-5 kV/mm direct current. This yielded piezoelectric elements 20 (FIG. 1) for Examples 1-4, Comparative Examples 1-8 and Reference Example 1 each comprising a piezoelectric ceramic 1 composed of a perovskite-type oxide having the composition shown in Table 1.

[Measurement of Crystal Phase Transition Temperature]
After setting the piezoelectric element 20 in an electric furnace, an LCR meter (trade name: HP4284A) was used for measurement of the temperature at which electrostatic capacity of the piezoelectric element was at maximum, during temperature increase and during temperature decrease across a temperature range of −40 to 300° C. The mean value for the measured values was recorded as the crystal phase transition temperature. The results are shown in Table 1. Phase transition of the crystals (orthorhombic-tetragonal) was confirmed using an X-ray diffraction apparatus (trade name: UltimaIII by Rigaku Corp.). The X-ray diffraction measuring conditions were as follows.

2θ angle: 10-80°
Scanning rate: 20°/min
Sampling step: 0.02°

Figure 3:
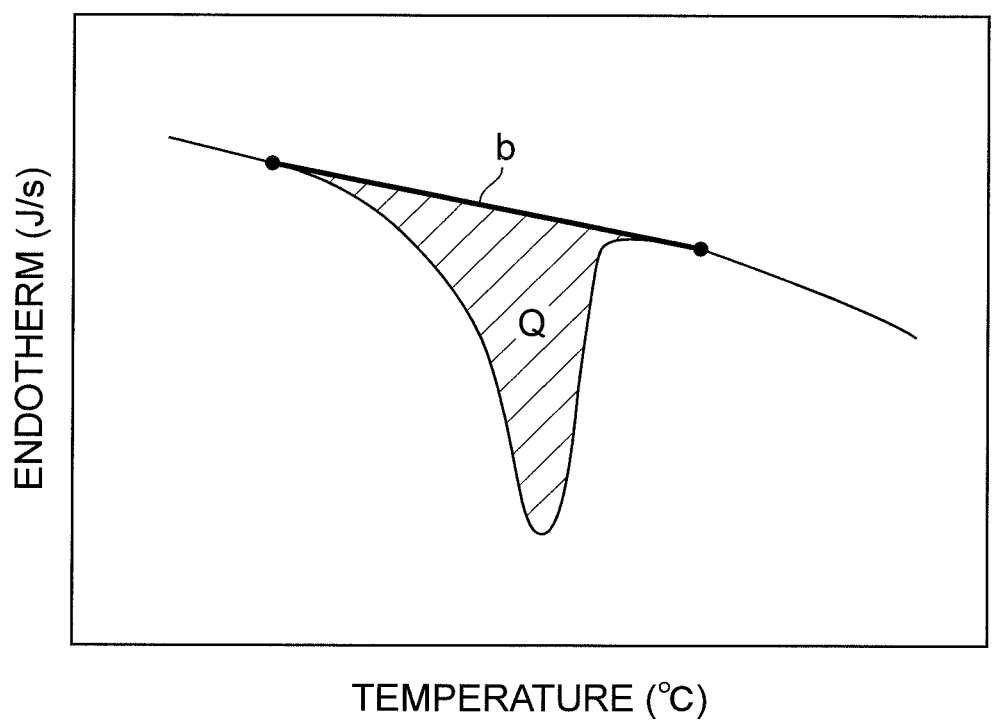
FIG. 3 is an illustration showing an example of analysis results for differential scanning calorimetry of a piezoelectric ceramic composed of a piezoelectric ceramic composition of the invention.

[Endotherm Measurement]
Sintered bodies (piezoelectric ceramics) having the compositions of Examples 1-4, Comparative Examples 1-8 and Reference Example 1 were pulverized to prepare powdered piezoelectric ceramic compositions. The endotherm accompanying crystal phase transition (orthorhombic-tetragonal) of each piezoelectric ceramic composition was measured by the following procedure. First, the piezoelectric ceramic composition was subjected to differential scanning calorimetry analysis and X-ray diffraction pattern measurement in parallel using a differential scanning calorimeter (trade name: DSC8230 by Rigaku Corp.) and an X-ray diffraction apparatus (trade name: UltimaIII by Rigaku Corp.), while increasing the temperature from −40° C. to 300° C. at 20° C./min. The heat flow rate was measured with the differential scanning calorimeter while confirming phase transition of the crystals by X-ray diffraction pattern measurement, and the endothermic peak near the crystal phase transition temperature was determined, as shown in FIG. 3.

The endotherm was determined in the following manner based on the measurement curve shown in FIG. 3. First, a baseline b was drawn connecting the half-line sections before and after the endothermic peak of the measurement curve. The area of region Q defined by the baseline b and the measurement curve was determined and recorded as the endotherm. An endotherm of "0" was recorded when absolutely no endothermic peak was detected. The endotherm per 1 g of measuring sample (J/g) was calculated from the obtained endotherm. The results are shown in Table 1. The X-ray diffraction measuring conditions were the same as for "Measurement of crystal phase transition temperature" above, and the differential scanning calorimetry analysis measuring conditions were as follows.

Measuring atmosphere: Nitrogen
Measuring sample size: Filled to specimen holder (7 mm×7 mm×0.25 mm)
DSC reference: Aluminum

[Measurement of Piezoelectric Constant]
The piezoelectric constant $d_{33}$ of the piezoelectric element 20 was measured using a $d_{33}$ meter (trade name: ZJ-4B, product of IAAS) at room temperature (20° C.). The results are shown in Table 1.

[Thermal Cycle Test]
The piezoelectric element 20 was loaded into a test chamber (trade name: MC810, product of Tabai) and a thermal cycle test was conducted with the following steps i) to iv) as one cycle. The piezoelectric constant $d_{33}$ of the piezoelectric element 20 after 10 cycles was measured in the same manner as "Measurement of piezoelectric constant" above. The results are shown in Table 1.
i) Holding at 125° C. for 30 minutes
ii) Temperature decrease from 120° C. to −40° C. at 5° C./min
iii) Holding at −40° C. for 30 minutes
iv) Temperature increase from −40° C. to 125° C. at 5° C./min

[Thermal Shock Test]
The piezoelectric element 20 was loaded into a test chamber (trade name: MC810, product of Tabai) and a thermal shock resistance test was conducted with the following steps i) to iv) as one cycle. The piezoelectric constant $d_{33}$ of the piezoelectric element 20 after 1000 cycles was measured in the same manner as "Measurement of piezoelectric constant" above. The results are shown in Table 1.

i) Holding at 125° C. for 15 minutes
ii) Temperature decrease from 125° C. to −55° C. at 72° C./min
iii) Holding at −55° C. for 15 minutes
iv) Temperature increase from −55° C. to 125° C. at 72° C./min Industrial Applicability According to the invention it is possible to provide a piezoelectric ceramic composition that adequately minimizes reduction in piezoelectric characteristics due to temperature variation and that can maintain excellent piezoelectric characteristics, as well as a piezoelectric element composed of the piezoelectric ceramic composition.

TABLE 1

|  | Composition | Crystal phase transition temperature ° C. | Endotherm J/g | Piezoelectric constant | | |
|---|---|---|---|---|---|---|
|  |  |  |  | Before heating test pC/N | After thermal cycle test pC/N | After thermal shock test pC/N |
| Example 1 | $0.955(Li_{0.050}Na_{0.567}K_{0.378}Ba_{0.005})(Nb_{0.9}Ta_{0.1})O_3$—$0.045SrZrO_3$ | 16 | 3 | 276 | 266 | 263 |
| Example 2 | $0.950(Li_{0.050}Na_{0.567}K_{0.378}Ba_{0.005})(Nb_{0.9}Ta_{0.1})O_3$—$0.050SrZrO_3$ | 26 | 0 | 298 | 299 | 296 |
| Example 3 | $0.940(Li_{0.050}Na_{0.567}K_{0.378}Ba_{0.005})(Nb_{0.9}Ta_{0.1})O_3$—$0.060SrZrO_3$ | 21 | 2 | 279 | 274 | 275 |
| Example 4 | $0.930(Li_{0.050}Na_{0.567}K_{0.379}Ba_{0.005})(Nb_{0.9}Ta_{0.1})O_3$—$0.070SrZrO_3$ | 17.6 | 3 | 258 | 252 | 250 |
| Comp. Ex. 1 | $(Li_{0.05}Na_{0.567}K_{0.378}Ba_{0.005})(Nb_{0.9}Ta_{0.1})O_3$ | 36 | 9 | 165 | 112 | 22 |
| Comp. Ex. 2 | $0.980(Li_{0.050}Na_{0.566}K_{0.379}Ba_{0.005})(Nb_{0.9}Ta_{0.1})O_3$—$0.020SrZrO_3$ | 9.1 | 11 | 270 | 189 | 59 |
| Comp. Ex. 3 | $0.960(Li_{0.050}Na_{0.567}K_{0.378}Ba_{0.005})(Nb_{0.9}Ta_{0.1})O_3$—$0.040SrZrO_3$ | 11.85 | 8 | 233 | 204 | 201 |
| Comp. Ex. 4 | $0.925(Li_{0.050}Na_{0.567}K_{0.378}Ba_{0.005})(Nb_{0.9}Ta_{0.1})O_3$—$0.075SrZrO_3$ | 14.9 | 5 | 130 | 121 | 102 |
| Comp. Ex. 5 | $0.940(Li_{0.049}Na_{0.561}K_{0.375}Ba_{0.016})(Nb_{0.9}Ta_{0.1})O_3$—$0.060SrZrO_3$ | 7.8 | 8 | 186 | 149 | 29 |
| Comp. Ex. 6 | $0.940(Li_{0.048}Na_{0.545}K_{0.366}Ba_{0.037})(Nb_{0.9}Ta_{0.1})O_3$—$0.060SrZrO_3$ | 6.9 | 7 | 168 | 134 | 26 |
| Comp. Ex. 7 | $(Li_{0.052}Na_{0.474}K_{0.474})(Nb_{0.948}Sb_{0.052})O_3$ | 35 | 6 | 260 | 232 | 32 |
| Comp. Ex. 8 | $(Li_{0.04}Na_{0.44}K_{0.52})(Nb_{0.85}Ta_{0.1}Sb_{0.05})O_3$ | 40 | 5 | 299 | 240 | 55 |
| Ref. Ex. 1 | $Pb[(Zn_{1/3}Nb_{2/3})_{0.1}Ti_{0.42}Zr_{0.48}]O_3$ | —(*1) | — | 482 | 480 | 478 |

(*1)No crystal phase transition in the measuring temperature range.

The piezoelectric ceramic compositions of Examples 1-4 were all confirmed to have excellent piezoelectric constants at room temperature. It was also confirmed that the piezoelectric ceramic compositions, while having tetragonal-orthorhombic crystal phase transition temperatures near device operating temperatures, all had smaller endotherms than the piezoelectric ceramic compositions of Comparative Examples 1-8, and that excellent piezoelectric constants were maintained even in the thermal cycle test and thermal shock test.

On the other hand, the piezoelectric ceramic compositions of Comparative Examples 1-8 had large endotherms accompanying crystal phase transition, and were confirmed to have significantly reduced piezoelectric constants in the thermal cycle test or thermal shock test.

The piezoelectric ceramic compositions of Examples 1-4 and Comparative Examples 2-6 were composed of solid solutions of 2-component systems, as shown in Table 1, but can also be represented as the general formula $ABO_3$, as shown in Table 2. That is, the piezoelectric ceramic compositions of Examples 1-4 are composed of perovskite-type oxides comprising Na, K, Li, Ba and Sr at the A site and Nb, Ta and Zr at the B site.

TABLE 2

| | Composition ($ABO_3$) |
|---|---|
| Example 1 | $(Li_{0.048}Na_{0.541}K_{0.361}Ba_{0.005}Sr_{0.045})(Nb_{0.86}Ta_{0.095}Zr_{0.045})O_3$ |
| Example 2 | $(Li_{0.047}Na_{0.539}K_{0.359}Ba_{0.005}Sr_{0.05})(Nb_{0.855}Ta_{0.095}Zr_{0.05})O_3$ |
| Example 3 | $(Li_{0.047}Na_{0.533}K_{0.355}Ba_{0.005}Sr_{0.06})(Nb_{0.846}Ta_{0.094}Zr_{0.06})O_3$ |
| Example 4 | $(Li_{0.046}Na_{0.527}K_{0.352}Ba_{0.005}Sr_{0.07})(Nb_{0.837}Ta_{0.093}Zr_{0.07})O_3$ |
| Comp. Ex. 2 | $(Li_{0.049}Na_{0.555}K_{0.371}Ba_{0.005}Sr_{0.02})(Nb_{0.882}Ta_{0.098}Zr_{0.02})O_3$ |
| Comp. Ex. 3 | $(Li_{0.048}Na_{0.544}K_{0.363}Ba_{0.005}Sr_{0.04})(Nb_{0.864}Ta_{0.096}Zr_{0.04})O_3$ |
| Comp. Ex. 4 | $(Li_{0.046}Na_{0.524}K_{0.35}Ba_{0.005}Sr_{0.075})(Nb_{0.833}Ta_{0.092}Zr_{0.075})O_3$ |
| Comp. Ex. 5 | $(Li_{0.046}Na_{0.527}K_{0.352}Ba_{0.015}Sr_{0.06})(Nb_{0.846}Ta_{0.094}Zr_{0.06})O_3$ |
| Comp. Ex. 6 | $(Li_{0.045}Na_{0.516}K_{0.344}Ba_{0.035}Sr_{0.06})(Nb_{0.846}Ta_{0.094}Zr_{0.06})O_3$ |

Explanation Of Symbols

1: Piezoelectric ceramic, 2, 3: electrodes, 10: stacked piezoelectric element, 11: laminated body, 12: piezoelectric layer, 13A, 13B: internal electrodes, 14: element assembly, 15, 16: protective layers, 17A, 17B: terminal electrodes, 18: active region, 19: inactive region, 20: piezoelectric element.

The invention claimed is:

1. A piezoelectric ceramic composition consisting of a perovskite-type oxide,
wherein the perovskite-type oxide has Na, K, Li, Ba and Sr at the A site and Nb, Ta and Zr at the B site,
the perovskite-type oxide is represented by the following formula (1), $$(1-n)(K_{1-x-y-w}Na_xLi_yBa_w)_m(Nb_{1-z}Ta_z)O_3 \text{-} nSrZrO_3 \quad (1),$$

wherein in formula (1), x, y, z, w, m and n satisfy the following inequalities;
$0.4 < x \leq 0.7$,
$0.02 \leq y \leq 0.3$,
$0.5 \leq x+y < 0.75$,
$0 < z \leq 0.3$,
$0 < w \leq 0.01$,
$0.98 \leq m \leq 1.0$,
$0.045 \leq n \leq 0.07$, and
the perovskite-type oxide has a crystal phase transition in a temperature range of -50 to 150° C., the crystal phase transition being accompanied by an endotherm of no greater than 4 J/g.

2. A piezoelectric element comprising:
a piezoelectric ceramic that composed of the piezoelectric ceramic composition according to claim 1; and
an electrode formed on the surface of the piezoelectric ceramic.

3. A piezoelectric element comprising:
an element assembly obtained by alternating lamination of internal electrodes and piezoelectric ceramics composed of the piezoelectric ceramic composition according to claim 1, and a pair of terminal electrodes that are formed at both end faces of the element assembly so as to sandwich the element assembly and are electrically connected to the internal electrodes.

4. A piezoelectric element comprising:

an element assembly obtained by alternating lamination of internal electrodes and piezoelectric ceramics composed of the piezoelectric ceramic composition according to claim 2, and a pair of terminal electrodes that are formed at both end faces of the element assembly so as to sandwich the element assembly and are electrically connected to the internal electrodes.

\* \* \* \* \*